United States Patent [19]

Seabury et al.

[11] Patent Number: 5,646,583
[45] Date of Patent: Jul. 8, 1997

[54] ACOUSTIC ISOLATOR HAVING A HIGH IMPEDANCE LAYER OF HAFNIUM OXIDE

[75] Inventors: Charles W. Seabury, Agoura; Paul H. Kobrin, Newbury Park; Jeffrey F. DeNatale, Thousand Oaks, all of Calif.

[73] Assignee: Rockwell International Corporation, Thousand Oaks, Calif.

[21] Appl. No.: 582,686

[22] Filed: Jan. 4, 1996

[51] Int. Cl.$^6$ ...................................... H03H 9/00
[52] U.S. Cl. .................. 333/187; 310/320; 333/188
[58] Field of Search ............................ 333/186–192; 310/320, 348

[56] References Cited

U.S. PATENT DOCUMENTS 3,767,579 10/1973 Tsubouchi et al. .
5,373,268 12/1994 Dworsky et al. ..................... 333/187

OTHER PUBLICATIONS

K.M. Laken, G.R. Kline, K.T. McCarron, "Development of Miniature Filters for Wireless Applications," IEEE, WE4A-1, pp. 883–886 (1995).

W.E. Newell, "Face-Mounted Piezoelectric Resonators," IEEE, vol. 53, pp. 575–581, Jun. 1965.

*Primary Examiner*—Benny T. Lee
*Assistant Examiner*—Darius Gambino

[57] ABSTRACT

A resonant acoustic isolator supports a thin film acoustic resonator comprising a layer of piezoelectric material having top and bottom electrical contacts. The resonant acoustic isolator comprises at least one pair of layers of materials having different acoustic impedances. The isolator materials are deposited in alternating layers of high and low impedance material, with each layer having a thickness of ¼ acoustic wavelength at resonant frequency. Silicon dioxide ($SiO_2$) is preferred for the low impedance material because it is ubiquitous in the semiconductor industry, it has relatively low acoustic impedance with very low intrinsic acoustic loss, and it can be deposited using a variety of convenient methods. Hafnium oxide ($HfO_2$) is preferred for the high acoustic impedance material because it can be deposited by evaporation to form a hard, dense dielectric having a relatively high acoustic impedance. Deposition of an entire stack of alternating $SiO_2$ and $HfO_2$ layers can be performed in the same chamber using electron beam deposition techniques for low cost production.

19 Claims, 1 Drawing Sheet

ACOUSTIC ISOLATOR HAVING A HIGH IMPEDANCE LAYER OF HAFNIUM OXIDE

TECHNICAL FIELD

The present invention relates to resonant acoustic devices that are commonly used as high frequency radio components and, in particular, to a resonant acoustic isolator having a high impedance layer formed of hafnium oxide.

BACKGROUND OF THE INVENTION

Electrically driven piezoelectric acoustic resonators have utility in a wide range of radio frequency applications. Piezoelectric acoustic resonators comprise a layer of piezoelectric material that has a thickness of ½ the acoustic wavelength at resonant frequency. Drive electrodes are formed on the top and bottom surfaces of the piezoelectric layer. A discrete piezoelectric resonator may be used, for example, as a frequency reference in an oscillator circuit. Several resonators can be combined in a ladder network to form a band pass filter.

For resonators, an important figure of merit is the quality factor (Q), defined as:

$$Q = \frac{f_0}{\Delta f},$$

where
$f_0$ is the center frequency and $\Delta f$ is the frequency width of the resonance. For a parallel plate resonator, $$Q = \frac{Q_m \cdot \pi}{\ln(R_1 \cdot R_2)},$$

where
$Q_m$ is the inherent Q of the resonator material, and $R_1$ and $R_2$ are the reflectivities of the two surfaces. For a free air (or vacuum) interface, the reflectivity R is very nearly 1. Thus, a piezoelectric thin film resonator can have a very high Q when freely suspended in air. Such resonators have been demonstrated in discrete form and as integrated filters.

Thin film resonators, however, are difficult to fabricate, very sensitive to stress, and very fragile. An alternative is to fabricate thin film resonators on solid supporting substrates. In this case, $R_1$ is essentially 1 for the top interface with air, but $R_2$ is determined by the acoustic impedance mismatch between the resonator material and the supporting substrate as follows:

$$R = \frac{Z_{a1} - Z_{a2}}{Z_{a1} + Z_{a2}}, \text{ where } Z_a = \sqrt{\rho C},$$

and where
$\rho$ is the material density and C is the acoustic velocity in the material. The larger the mismatch in acoustic impedance between the resonator material and supporting substrate, the larger the reflection. Unfortunately, the range of acoustic impedance values in available materials is not large enough to yield a very high Q for a single interface. However, if a sequence of layers of alternating high and low impedance materials is used, with each layer having a thickness of ¼ acoustic wavelength at the resonant frequency, the reflections from each pair of layers (high and low impedance material) combine in phase at the resonant frequency. For normal incidence, the one-dimensional case yields a total reflectivity of $$R' = 1 - (1-R)^N,$$

where
R' is the reflectivity of each pair of layers and N is the number of pairs. Thus, the Q of a resonator mounted on such a resonant acoustic isolator can be expressed as $$Q = \frac{Q_m \cdot \pi}{\ln\left(1 - \left(1 - \frac{Z_{a1} - Z_{a2}}{Z_{a1} + Z_{a2}}\right)^N\right)}.$$

If the material losses are low, nearly arbitrary reflectivity can be achieved by using a sufficiently large number of layers. However, to minimize the number of pairs of layers required, one should choose materials with a large acoustic mismatch. For ease in fabricating a thin film piezoelectric resonator (including top and bottom electrodes) directly on the supporting layers of the acoustic isolator, it is highly desirable that reflector materials comprise electrical insulators. Thus, devices can be isolated by patterning the drive electrodes without the necessity of patterning the supporting layers of the acoustic isolator.

Silicon dioxide ($SiO_2$) can be effective as the low impedance layer ($Z_a \approx 13$) in a resonant acoustic isolator because it is a low loss material, it can be deposited by a variety of techniques, and it is ubiquitous in the semiconductor world. There is a need, however, for a high acoustic impedance material that can be readily deposited using a technique compatible with $SiO_2$ deposition to form a multilayer resonant acoustic isolator.

SUMMARY OF THE INVENTION

The present invention comprises a multilayer resonant acoustic isolator that may be used for supporting a thin film acoustic resonator. The acoustic resonator typically comprises a film of piezoelectric material having top and bottom electrical contacts. The resonator can be formed atop the resonant acoustic isolator, which comprises at least one pair of layers of materials having different acoustic impedances. The pairs of layers are formed atop a substrate in the form of alternating layers of high and low impedance material, with each layer having a thickness of ¼ acoustic wavelength at the resonant frequency. Reflectivity of the isolator is increased by using pairs of layers because the reflections from each pair of layers combine in phase at the resonant frequency. Silicon dioxide ($SiO_2$) is preferred for the low impedance material because it is ubiquitous in the semiconductor industry, it has relatively low acoustic impedance (approximately 13) with very low intrinsic acoustic loss, and it can be deposited using a variety of convenient methods. Hafnium oxide ($HfO_2$) is preferred for use as the high acoustic impedance material because it can be deposited by evaporation to form a hard, dense dielectric having a relatively high acoustic impedance (approximately 40). This structure has an advantage for low cost production because multiple wafers can be coated at one time, with an entire stack of alternating $SiO_2$ and $HfO_2$ layers deposited in the same chamber using electron beam deposition techniques.

A principal object of the invention is an effective resonant acoustic isolator that can support a thin film acoustic resonator. A feature of the invention is at least one pair of ¼ acoustic wavelength layers comprising a layer of low acoustic impedance material and a layer of high acoustic impedance material consisting of hafnium oxide. An advantage of the invention is ease of deposition of high impedance hafnium oxide in conjunction with commonly used low impedance materials.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

The present invention comprises a multilayer resonant acoustic isolator. An embodiment of an acoustic isolator 10 combined with a thin film acoustic resonator is shown in schematic cross section in FIG. 1. Acoustic isolator 10 is formed on a substrate 11, which may comprise an insulator, such as glass, for example. Acoustic isolation materials having high and low acoustic impedance are deposited in pairs of alternating layers, such as layers 12 and 13 (and optional layers 14 and 15, for example), on substrate 11.

Figure 1:
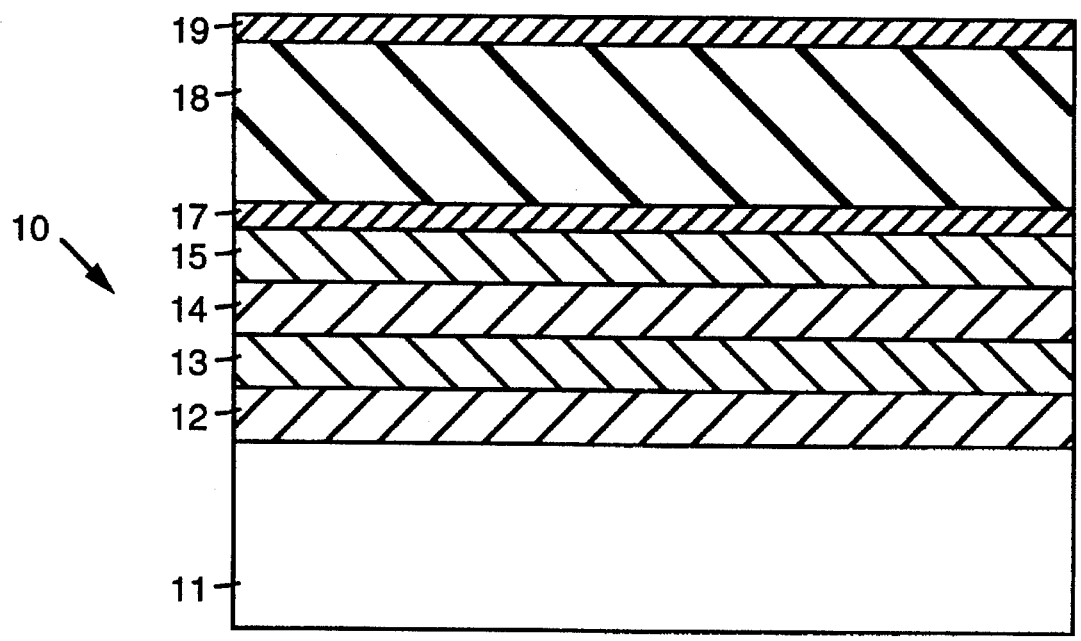
FIG. 1 is a schematic cross section of an acoustic resonator of the present invention.

As illustrated in FIG. 1, acoustic isolator 10 provides support for an acoustic resonator comprising a layer of piezoelectric material 18 having bottom and top electrical contacts 17 and 19, respectively. The layer of piezoelectric material 18 typically has a thickness of ½ the acoustic wavelength at resonant frequency. Layers 12 and 13 of acoustic isolator 10 are formed atop substrate 11 in alternating layers of high and low impedance material, with each layer having a thickness of ¼ acoustic wavelength at resonant frequency. It is advantageous to use paired layers (such as layers 12 and 13) comprising materials having a significant difference in acoustic impedance, with the low impedance material proximate the acoustic resonator, to produce high reflectivity and low acoustic loss with a small number of layer pairs. In a preferred embodiment of the present invention, the high impedance material (layers 12 and 14 in FIG. 1, for example) comprises hafnium oxide ($HfO_2$) and the low impedance material (layers 13 and 15 in FIG. 1, for example) comprises silicon dioxide ($SiO_2$).

Figure 2:
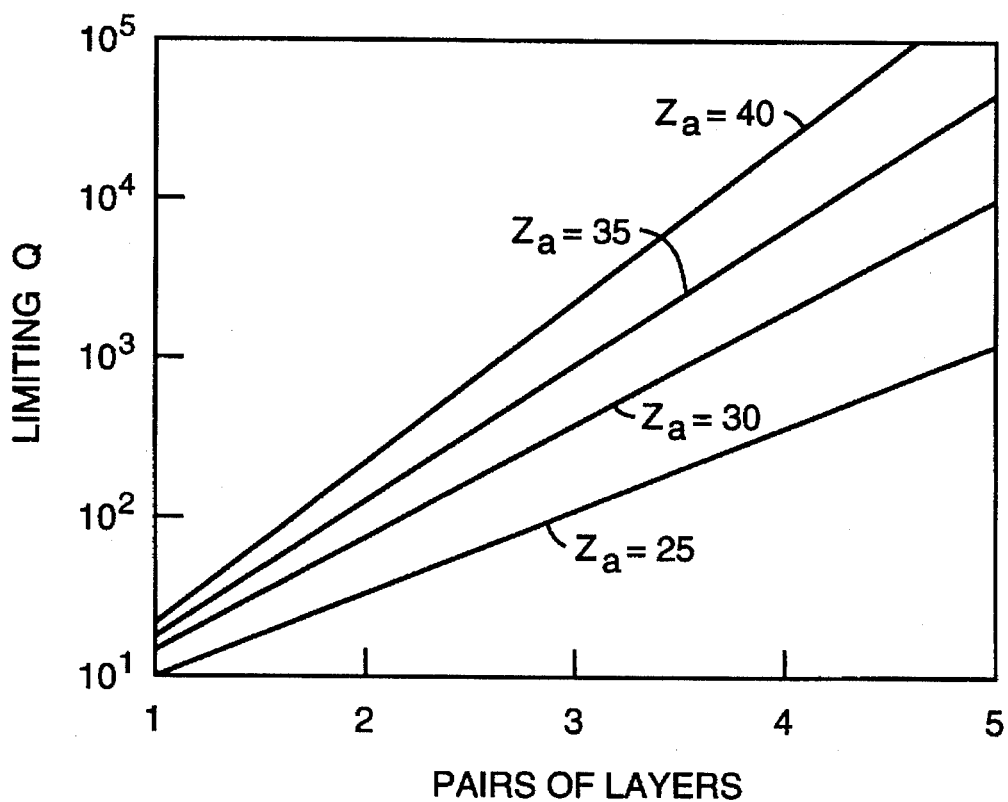
FIG. 2 is a graph of Limiting Q versus number of Pairs of Layers using high impedance material having values of $Z_a \approx 25$ to 40.

FIG. 2 is a graph showing the effective Q (as defined above) of a thin film piezoelectric acoustic resonator (having a top free air surface) mounted on a resonant acoustic isolator 10 comprising various numbers of pairs of ¼ acoustic wavelength layers (as described above). Silicon dioxide is assumed to be the low impedance material for all curves and the high impedance material ranges from $Z_a = 25$ to 40. The substrate is silicon and the thin film piezoelectric resonator itself is assumed to have impedance $Z_a = 35$. As can be seen from FIG. 2, higher Q can be achieved with fewer pairs of acoustic isolator layers when the difference between the impedances of the high and low impedance materials is greatest.

Silicon dioxide is preferred for the low impedance material because it is ubiquitous in the semiconductor industry, it has very low intrinsic acoustic loss with relatively low acoustic impedance ($Z_a$ of approximately 13), and it can be deposited using a variety of convenient methods. Hafnium oxide is particularly suited for use in the alternate layers of high acoustic impedance material of because it can be deposited by sputtering or electron beam evaporation with concurrent ion bombardment, for example, to form a hard, dense dielectric having a relatively high acoustic impedance ($Z_a$ of approximately 40).

Alternative high acoustic impedance materials, such as $TiO_2$ and $ZrO_2$, have nearly the same acoustic impedance as $HfO_2$ and can be evaporated, but because they have lower density and higher acoustic velocity, thicker films are required to reach ¼ acoustic wavelength. Various metals have higher acoustic impedance, but because thin film acoustic resonators must be confined in area, the multiple layers of the acoustic isolator would have to be patterned to electrically insulate them from the electrical contacts 17 and 19 of piezoelectric resonator 18. Aluminum nitride and zinc oxide ($Z_a$ of approximately 35) may be used as the high impedance material, but because of their lower impedance compared with hafnium oxide, more pairs of layers are needed to reach the same reflectivity, as illustrated in FIG. 2. Furthermore, aluminum nitride and zinc oxide cannot be deposited effectively by evaporation. Layers of these materials can be formed by laser assisted deposition or sputtering, but these non-batch processes are inherently more expensive.

In fabricating resonant acoustic isolator 10, $HfO_2$ films evaporated at low temperatures have been found to be acoustically lossy. Raising the substrate temperature above 400° C. increases the density, but the films become polycrystalline with rough surfaces that produce unacceptable acoustic scattering. However, ion assisted electron beam evaporation (i.e., electron beam evaporation with concurrent ion bombardment, as known in the prior art), has been used to achieve the required bulk density and hardness while maintaining a smooth surface. Such films have been found to exhibit low acoustic loss. Very high reflectivity layers have been produced by this method, resulting in high performance resonant acoustic isolators.

Although the present invention has been described with respect to specific embodiments thereof, various changes and modifications can be carded out by those skilled in the art without departing from the scope of the invention. Therefore, it is intended that the present invention encompass such changes and modifications as fall within the scope of the appended claims.

We claim:

1. A resonant acoustic isolator, comprising:

a substrate;

a pair of layers deposited on said substrate;

said pair of layers comprising a first layer of material having a high acoustic impedance and a second layer of material having a low acoustic impedance; and said first layer of high acoustic impedance material comprising hafnium oxide.

2. The resonant acoustic isolator of claim 1, wherein said second layer of low acoustic impedance material comprises silicon dioxide.

3. The resonant acoustic isolator of claim 1, further comprising a plurality of pairs of said first and second layers forming a stack of alternating layers of said high and low acoustic impedance materials.

4. The resonant acoustic isolator of claim 1, further comprising a thin film acoustic resonator formed atop said second layer of low acoustic impedance material.

5. The resonant acoustic isolator of claim 4, wherein each of said first and second layers has a thickness of ¼ acoustic wavelength at a resonant frequency of said acoustic resonator.

6. The resonant acoustic isolator of claim 1, wherein said first layer of hafnium oxide is deposited by electron beam evaporation with concurrent ion bombardment.

7. The resonant acoustic isolator of claim 1, wherein said first layer of hafnium oxide is deposited by sputtering.

8. A resonant acoustic isolator for a thin film acoustic resonator, comprising:

a substrate;

a pair of layers formed on said substrate, said pair of layers including a first layer of high acoustic impedance hafnium oxide and a second layer of low acoustic impedance material; and the thin film acoustic resonator formed atop said pair of layers.

9. The resonant acoustic isolator of claim 8, wherein said second layer of low acoustic impedance material comprises silicon dioxide.

10. The resonant acoustic isolator of claim 8, further comprising a plurality of pairs of said first and second layers forming a stack of alternating layers of said high and low acoustic impedance materials on said substrate.

11. The resonant acoustic isolator of claim 8, wherein each of said layers has a thickness of ¼ acoustic wavelength at a resonant frequency of the acoustic resonator.

12. The resonant acoustic isolator of claim 8, wherein said first layer of hafnium oxide is deposited by electron beam evaporation with concurrent ion bombardment.

13. The resonant acoustic isolator of claim 8, wherein said first layer of hafnium oxide is deposited by sputtering.

14. A thin film acoustic resonator having a resonant acoustic isolator, comprising:

a substrate;

at least one pair of alternating layers deposited on said substrate to form the resonant acoustic isolator;

each of said at least one pair of alternating layers including a first layer of high acoustic impedance hafnium oxide and a second layer of low acoustic impedance material; and the thin film resonator comprising a layer of piezoelectric material with top and bottom electrical contacts formed on said at least one pair of alternating layers.

15. The thin film acoustic resonator of claim 14, wherein said second layer of low acoustic impedance material comprises silicon dioxide.

16. The thin film acoustic resonator of claim 14, wherein said at least one pair of layers comprises a stack of alternating layers of said high and low acoustic impedance materials on said substrate.

17. The thin film acoustic resonator of claim 16, wherein each of said alternating layers of said high and low acoustic impedance materials has a thickness of ¼ acoustic wavelength at a resonant frequency of the acoustic resonator.

18. The thin film acoustic resonator of claim 16, wherein each of said first layers of hafnium oxide is deposited by electron beam evaporation with concurrent ion bombardment.

19. The thin film acoustic resonator of claim 16, wherein each of said first layers of hafnium oxide is deposited by sputtering.

* * * * *